United States Patent
Dilbeck

[19]

[11] Patent Number: 5,828,623
[45] Date of Patent: Oct. 27, 1998

[54] PARALLEL WRITE LOGIC FOR MULTI-PORT MEMORY ARRAYS

[75] Inventor: Stephen D. Dilbeck, Moraga, Calif.

[73] Assignee: Integrated Device Technology, Inc., Santa Clara, Calif.

[21] Appl. No.: 606,115

[22] Filed: Feb. 23, 1996

(Under 37 CFR 1.47)

[51] Int. Cl.$^6$ ........................................................ G11C 8/00
[52] U.S. Cl. ........................................ 365/230.05; 365/156
[58] Field of Search .............................. 365/156, 230.05, 365/230.06

[56] References Cited

U.S. PATENT DOCUMENTS

| | | | |
|---|---|---|---|
| 5,477,502 | 12/1995 | Hayashi | 365/156 |
| 5,481,495 | 1/1996 | Henkels et al. | 365/230.05 |
| 5,561,638 | 10/1996 | Gibson et al. | 365/230.05 |
| 5,629,901 | 5/1997 | Ho | 365/230.05 |
| 5,646,893 | 7/1997 | McMinn et al. | 365/230.05 |

*Primary Examiner*—A. Zarabian
*Attorney, Agent, or Firm*—Skjerven, Morrill, MacPherson, Franklin & Friel

[57] ABSTRACT

In a traditional multi-port memory, the writing of a memory cell is performed only by the single port which is enabled for writing. Row contention occurs when other ports access the same memory cell, such as when ports share the same row address, and when the other ports are reading previously-stored data of opposite polarity. A parallel write capability is disclosed which eliminates such row contention by using the other ports of a multi-port memory to assist in writing the memory cell. By forcing the other ports into a write of the same data there can be no contention. Whenever a read port accesses the same row as a write port, the read port's bitline corresponding to the selected column for the write port is also forced into a write of the write port's data, along with the write port's bitline corresponding to the selected column of the write port. The read port's data is unaffected regardless of whether the selected column for the read port differs from the selected column for the write port. Row contention is also eliminated when multiple ports simultaneously write. For example, when a first port writes a memory cell at a first column, any other port sharing the same row address is forced into a write state on that first column to assist in writing the first port's selected memory cell. If a second port writes a memory cell sharing the same row address but located at a second column, the first port is forced into a write on the second column to assist in writing the second port's selected memory cell. Even if a port is writing, it will assist any other port in writing that port's selected memory cell if there is row contention. The present invention advantageously allows use of a "4T" memory cell (having high value resistor loads) when the number of incorporated ports would previously have required the use of a "6T" memory cell. By using a "4T" memory cell, a much smaller die size is achievable. Moreover, since the write port never has to discharge bitlines associated with a read port through the memory cell access transistors, many of the write timing parameters are dramatically improved.

33 Claims, 11 Drawing Sheets

PARALLEL WRITE LOGIC FOR MULTI-PORT MEMORY ARRAYS

BACKGROUND OF THE INVENTION

1. Field of the Invention

The present invention relates to read/write memory arrays, and more particularly to those arrays having multiple read/write ports thereto.

2. Description of the Related Art

In a traditional single-port memory array, a single address is presented to the array, and a memory cell identified by that address is either written with data presented to the port, or is read from the array and thus drives data outputs corresponding to the port. The single address may include a large number of individual address bits to fully specify each of the individual memory cells in the array. For example, a 20-bit address is required for a 1 megabit (1MB) memory array which has a single data input/output bit (a 1MB×1 memory array). The number of memory cells selected by a particular address may be one, as in the above example, or may be more than one. Memory arrays which simultaneously address, for example, eight bits of data are frequently desirable to increase the amount of data which is either read or written during each memory operation. In such a "byte-wide" memory array eight memory cells are simultaneously selected for each particular address presented to the port. In a write cycle (i.e., write operation) each of the selected memory cells is written with a respective one of eight bits of data presented to the port. Conversely, in a read cycle (i.e., read operation) each of eight data outputs for the port is driven with data read from a respective one of the eight selected memory cells. Memory arrays as discussed above may be configured as part of a commodity memory product (such as the well known products of the type typically incorporated into a memory SIMM for a personal computer), or may be configured as part of a larger system, such as a processor, cache subsystem, DMA channel, network interface, or a wide variety of other systems or subsystems.

While the great bulk of memory used today is configured with a single port as described above, memory arrays which are addressed independently by more than one port, known as multi-port memory arrays, are increasingly used by system architects to achieve a variety of performance and/or functionality goals. For example, dual-port memory arrays are frequently used as buffers between two subsystems which are asynchronous to each other. FIFO's (first-in-first-out buffers) are specialized sequentially-accessed dual-port memories. Moreover, memories specially adapted for frame memory within a video system (e.g., VRAMs) allow simultaneous and independent access by both a processor as well as a video subsystem so that each is not interrupted when the other accesses the memory array. A register file of a processor may be configured with two read ports and one write port, so that two operands for a pending operation may be simultaneously retrieved while a result from a completed operation is written. Other sophisticated applications continue to require an even greater number of ports into a memory array. Achieving additional ports in a memory array has traditionally resulted in a significant penalty in chip area or die size (the layout size of the memory array) as well as a penalty in performance of the memory array. To achieve large numbers of ports, high-density high-performance memory array structures cannot be used, and structures resembling a logic gate implementation of the memory array are frequently used instead.

A traditional "4T-2R" single-port static memory cell (also sometimes known as a "4T" cell) is depicted in FIG. 1. Two cross-coupled N-channel transistors (transistors 116 and 118) form the basic storage element of the memory cell 101. These transistors 116 and 118 couple internal nodes 108 and 110, respectively, to a common terminal 100 which is typically connected to receive a reference voltage such as electrical ground. For descriptive convenience, such a common terminal 100 is commonly referred to as a ground terminal, and will hereinafter be referred to as ground terminal 100. Resistors 120 and 122 couple internal nodes 108 and 110, respectively, to a power supply terminal 105 which is typically connected to receive a positive power supply voltage which may typically be in the several volt range, with 3.3 volts and 5.0 volts being common examples. Such a positive power supply voltage is frequently referred to as a $V_{DD}$ voltage, and for descriptive convenience the power supply terminal 105 will hereinafter be referred to as $V_{DD}$ terminal 105. The resistors 120 and 122 are typically implemented using a high resistivity polysilicon film which is largely stacked above the transistors of the memory cell which are implemented in lower semiconductor layers. Consequently, use of such resistors 120 and 122 results frequently in a smaller memory cell layout than an alternative "6T" memory cell design which uses P-channel transistors for the load elements (See FIG. 3 and related discussion hereinafter). The two resistors 120 and 122 are designed to be extremely high magnitude resistors in order to minimize the static current flow (i.e., the "DC" current) through the memory cell 101.

The internal nodes 108 and 110 of the memory cell 101 are coupled through a pair of N-channel access transistors 112 and 114 to a pair of respective bit lines 104 and 106. These bitlines 104 and 106 are used for both reading and writing the memory cell 101 when the wordline 102 is enabled and provide for a single data port into the memory cell 101. One of the bitlines, such as bitline 104, is commonly referred to as the true bitline 104 and the other bitline, such as bitline 106, is commonly referred to as the complement bitline 106. Since the cell is symmetrical, such a designation is arbitrary at the cell level and in practice may result from product data polarity designations or designer preference. For convenience, the pair of bitlines 104 and 106 may hereinafter also be referred to as the true bitline 104 and the complement bitline 106. The operation of a such a memory cell 101 depicted in FIG. 1 is well known by those skilled in the art.

A traditional "4T-2R" dual-port static memory cell 151 is depicted in FIG. 2. As before, two cross-coupled N-channel transistors (transistors 166 and 168) form the basic storage element of the memory cell 151. These transistors 166 and 168 couple internal nodes 158 and 160, respectively, to the ground terminal 100. Resistors 170 and 172 couple internal nodes 158 and 160, respectively, to the $V_{DD}$ terminal 105. The resistors 170 and 172 are likewise typically implemented using a high resistivity polysilicon film and are designed to be extremely high magnitude resistors.

The internal nodes 158 and 160 of the memory cell 151 are coupled through a first pair of N-channel access transistors 162 and 164 to a first pair of bit lines 154 and 156, and are also coupled through a second pair of N-channel access transistors 163 and 165 to a second pair of bit lines 155 and 157. The first pair of bitlines 154 and 156 is used for both reading and writing the memory cell 151 when a first wordline 152 is enabled, and together provide for a first data port into the memory cell 151. The second pair of bitlines 155 and 157 is similarly used for both reading and writing the same memory cell 151 when a second wordline 153 is enabled, and together provide for a second data port into the same memory cell 151. For convenience, the first pair of bitlines 154 and 156 may hereinafter also be individually referred to as the port 1 true bitline 154 and the port 1 complement bitline 156, respectively. Furthermore, the second pair of bitlines 155 and 157 may hereinafter also be individually referred to as the port 2 true bitline 155 and the port 2 complement bitline 157, respectively.

An alternative arrangement of a dual-port static memory cell is depicted in FIG. 3. Memory cell 151a has load elements fashioned from a pair of cross-coupled P-channel transistors rather than from high value polysilicon resistors. Cross-coupled P-channel transistors 174 and 176 couple internal nodes 158a and 160a, respectively, to the $V_{DD}$ terminal 105. As mentioned before, such a cell traditionally results in a larger cell layout not only due to the inclusion of two additional transistors, but also due to the requirement for providing N-well to P-well isolation within each memory cell of a memory array. Potential advantages of P-channel loads for a multi-port memory cell are discussed further herebelow.

A four-port memory cell having resistor loads is depicted in FIG. 4 as memory cell 201. It should be noted that such a four-port memory cell 201 has not been successfully implemented, although it is seemingly a straightforward extension of the two-port memory cell 151 shown in FIG. 2, for the reasons to be described below (and potentially for other reasons, as well). As before, two cross-coupled N-channel transistors 216 and 218 form the basic storage element of the memory cell 201 and couple internal nodes 208 and 210, respectively, to the ground terminal 100. Resistors 220 and 222 couple the internal nodes 208 and 210, respectively, to the $V_{DD}$ terminal 105. The resistors 220 and 222 are likewise typically implemented using a high resistivity polysilicon film and are designed to be extremely high magnitude resistors.

The internal nodes 208 and 210 of the memory cell 201 are coupled through a first pair of N-channel access transistors 212.1 and 214.1 to a first pair of bit lines 204.1 and 206.1, thus forming a first port. A second pair of N-channel access transistors 212.2 and 214.2 couples the internal nodes 208 and 210, respectively, to a second pair of bit lines 204.2 and 206.2, thus forming a second port. A third pair of N-channel access transistors 212.3 and 214.3 couples the internal nodes 208 and 210, respectively, to a third pair of bit lines 204.3 and 206.3, thus forming a third port. Lastly, a fourth pair of N-channel access transistors 212.4 and 214.4 couples the internal nodes 208 and 210, respectively, to a fourth pair of bit lines 204.4 and 206.4, thus forming a fourth port. A first wordline 202.1 is connected to the gate terminal of access transistors 212.1 and 214.1 to control the first port. Similarly, additional wordlines 202.2, 202.3, and 202.4 control the second, third, and fourth ports, respectively. Referring to the first port, the bitlines 204.1 and 206.1 may be defined to be the true and complement bitlines, respectively, for port 1, and for convenience may also be referred to as bitlines BL__P1 and XBL__P1 (the initial character "X" implying the complement polarity). Similarly, the bitlines 204.2 and 206.2 would follow as true and complement bitlines, respectively, for port 2, and may be referred to as bitlines BL__P2 and XBL__P2; bitlines 204.3 and 206.3 would follow as true and complement bitlines, respectively, for port 3, and may be referred to as bitlines BL__P3 and XBL__P3; and bitlines 204.4 and 206.4 would follow as true and complement bitlines, respectively, for port 4, and may be referred to as bitlines BL__P4 and XBL__P4.

A well designed memory cell (having an adequately high ratio of the cross-coupled transistors (e.g., transistor 218) to the access transistors (e.g., transistor 214.4)) is usually able to be read by virtually any number of read ports. However, a significant problem materializes as the number of ports which can write to the cell increases. This can be illustrated by first assuming that a logical "0" is stored within the memory cell 201. This results in a low voltage, $V_{LO}$, on internal node 208, and a high voltage, $V_{HI}$, on internal node 210, as indicated in FIG. 4. Next assume that ports 1, 2, and 3 are enabled to read the memory cell, while port 4 is enabled to write a logical "1" (being opposite data to that previously stored) into the memory cell 201. To write a logical "1" through port 4, bitline BL__P4 is driven high and bitline XBL__P4 is driven low. Since all 4 ports are active, all four wordlines 202.1, 202.2, 202.3, and 202.4 are active and thus driven high. A write current, IWR, flows from internal node 210 through access transistor 214.4 to the bitline XBL__P4 to cause the memory cell 201 to change states. Such a state change occurs when the voltage on internal node 210 decreases sufficiently to turn transistor 216 substantially off, thus allowing access transistor 212.4 to charge internal node 208 to a higher voltage. Such a high voltage on internal node 208 turns on transistor 218 and causes the voltage of internal node 210 to remain well below the threshold voltage of transistor 216, even after the write operation has concluded and the access transistors 212.4 and 214.4 have turned off. The voltage of internal node 210 must be driven to a rather low voltage for transistor 216 to begin to turn off, which is necessary before the cell data can switch states.

Achieving a sufficiently low voltage on internal node 210 is made more difficult by the simultaneous reading of the same memory cell 201 through port 1, port 2, and port 3, however. As internal node 210 falls in voltage, a read current, $I_{RD}$, flows from bitline XBL__P1 through access transistor 214.1 to internal node 210. Likewise, a read current, $I_{RD}$, also flows from bitline XBL__P2 through access transistor 214.2, and from bitline XBL__P3 through access transistor 214.3, all as shown in FIG. 4. The source of this read current $I_{RD}$ is two-fold. A first component originates from each of the bitline load devices 230 connected to each of the bitlines. But even if such load devices 230 are made smaller, a second component arises from the capacitance of the bitlines themselves. In the above example, each of bitlines XBL__P1, XBL__P2, and XBL__P3 would have to be significantly discharged by the read current $I_{RD}$ before the memory cell 201 is written to a logical "1," and all of the current to discharge the three bitlines which are engaged in reading must be conducted through access transistor 214.4. This results in a huge variation in the write time of a cell depending upon the number of other ports which are reading the same cell. Moreover, the conditions described in the example above are true not only for other read ports accessing the same cell, but are also true for any other cell sharing the same wordlines: that is, whenever the row address of a port which is reading is the same as the row address of a port that is writing, even if the column addresses are different. Such a problem may be called row contention of a multi-port array.

As additional ports are added to a memory cell, it is possible that a single write port is unable to sufficiently discharge a cell to ever write the data, no matter how much time is allowed for the discharging of bitlines associated with ports which are reading. This occurs when the effective voltage divider formed between access transistors which are reading (in the above example, e.g., access transistors 214.1, 214.2, and 214.3 acting in parallel) and the access transistor which is writing (e.g., access transistor 214.4) is insufficient to drive the internal node of the memory cell (e.g., internal node 210) below the trip point of the memory cell.

This row contention phenomenon may be reduced by utilizing a memory cell having P-channel load devices, analogous to that shown in FIG. 3, because the trip point of such a memory cell can be made to be higher than a memory cell utilizing high resistance polysilicon load resistors. But the lengthening of write timing due to the necessary discharging of bitlines associated with ports which are reading still creates a tremendously undesirable characteristic for a user of the multi-port memory array to deal with.

What is needed is a memory structure which can support additional numbers of ports without either a static write incapability, nor a dynamic write timing penalty when row addresses on multiple ports happen to match. What is needed, in other words, is a memory structure which eliminates row contention.

SUMMARY OF THE INVENTION

In a traditional multi-port memory, the writing of a memory cell is performed only by the single port which is enabled for writing. Row contention occurs when other ports access the same memory cell, such as when the ports share the same row address, and when the other ports are reading previously-stored data of opposite polarity. Consequently, it becomes harder to write a memory cell as more and more ports are allowed to access the memory cell.

The present invention allows a memory cell to be accessed by any number of ports, whether read ports or write ports. Moreover, the present invention eliminates such row contention by using the other ports of a multi-port memory to assist in writing the memory cell. By forcing the other ports into a write of the same data there can be no contention. Whenever a read port accesses the same row as a write port, the read port's bitline corresponding to the selected column for the write port is also forced into a write of the write port's data, along with the write port's bitline corresponding to the selected column of the write port. The read port's data is unaffected regardless of whether the selected column for the read port differs from the selected column for the write port. If they differ, the data access for the read port originates from a different column's bitline, and is unaffected by other column's bitlines of the read port which are forced into a write mode. If the column addresses are the same, the read port is accessing the same memory cell as the write port (since the row addresses are already known to be the same), and the read port will follow the write data anyway. If multiple columns are selected by a single write port, as in a multiple I/O array, then each behaves as described above.

The present invention also eliminates row contention when multiple ports simultaneously write to different columns along the same row. For example, when a first port writes a memory cell at a first column, any other port sharing the same row address is forced into a write state on that first column to assist in writing the first port's selected memory cell. If a second port writes a memory cell sharing the same row address but located at a second column, the first port is forced into a write on the second column to assist in writing the second port's selected memory cell. Even if a port is writing, it will assist any other port in writing that other port's selected memory cell if there is row contention.

The present invention also advantageously allows use of a "4T" memory cell (having high value resistor loads) when the number of incorporated ports would previously have required the use of a "6T" memory cell. By using a "4T" memory cell, a much smaller die size is achievable. Moreover, since a write port never has to discharge bitlines associated with a read port through the memory cell access transistors, many of the write timing parameters are dramatically improved.

In one method embodiment suitable for a memory array having a first port and a second port, a method of writing a selected memory cell corresponding to a first address presented to the first port with data presented to the first port includes the steps of selecting a first port selected row and first port selected column corresponding to the first address presented to the first port and selecting a second port selected row and second port selected column corresponding to a second address presented to the second port. The method then includes driving a first bitline pair associated with the first port and located within the first port selected column in accordance with the data presented to the first port, and if the first port selected row matches the second port selected row and the first port selected column does not match the second port selected column, then driving a second bitline pair in accordance with the data presented to the first port, said second bitline pair associated with the second port and located within the first port selected column.

In an apparatus embodiment of the current invention for a memory array having a first port capable of writing a first memory cell corresponding to an address presented to the first port with write data presented to the first port, and having a second port capable of writing a second memory cell corresponding to an address presented to the second port with write data presented to the second port, a column interface circuit includes a first selector circuit having a first input coupled to a data line conveying the write data presented to the first port, having a second input coupled to a data line conveying the write data presented to the second port, and having an output. The column interface circuit also includes a second selector circuit having a first input coupled to a data line conveying the write data presented to the first port, having a second input coupled to a data line conveying the write data presented to the second port, and having an output. The column interface circuit further includes a first driver circuit having an input coupled to the output of the first selector circuit, and having a pair of outputs coupled to a bitline pair corresponding to the first port, and a second driver circuit having an input coupled to the output of the second selector circuit and having a pair of outputs coupled to a bitline pair corresponding to the second port.

In an additional apparatus embodiment of the current invention for a memory array having a first port capable of writing a first memory cell corresponding to an address presented to the first port with write data presented to the first port, and having a second port capable of writing a second memory cell corresponding to an address presented to the second port with write data presented to the second port, a column interface circuit includes a first selector circuit for selecting write data corresponding to one of the first port and the second port, and a second selector circuit for selecting write data corresponding to one of the first port and the second port. The column interface circuit further includes a first driver circuit responsive to the first selector circuit, the first driver circuit for driving a first bitline pair in accordance with write data selected by the first selector circuit, the first bitline pair associated with the first port, and a second driver circuit responsive to the second selector circuit, the second driver circuit for driving a second bitline pair in accordance with write data selected by the second selector circuit, the second bitline pair associated with the second port.

BRIEF DESCRIPTION OF THE DRAWINGS

The present invention may be better understood, and its numerous objects, features, and advantages made apparent to those skilled in the art by referencing the accompanying drawings.

DETAILED DESCRIPTION OF THE PREFERRED EMBODIMENTS

Figure 1:
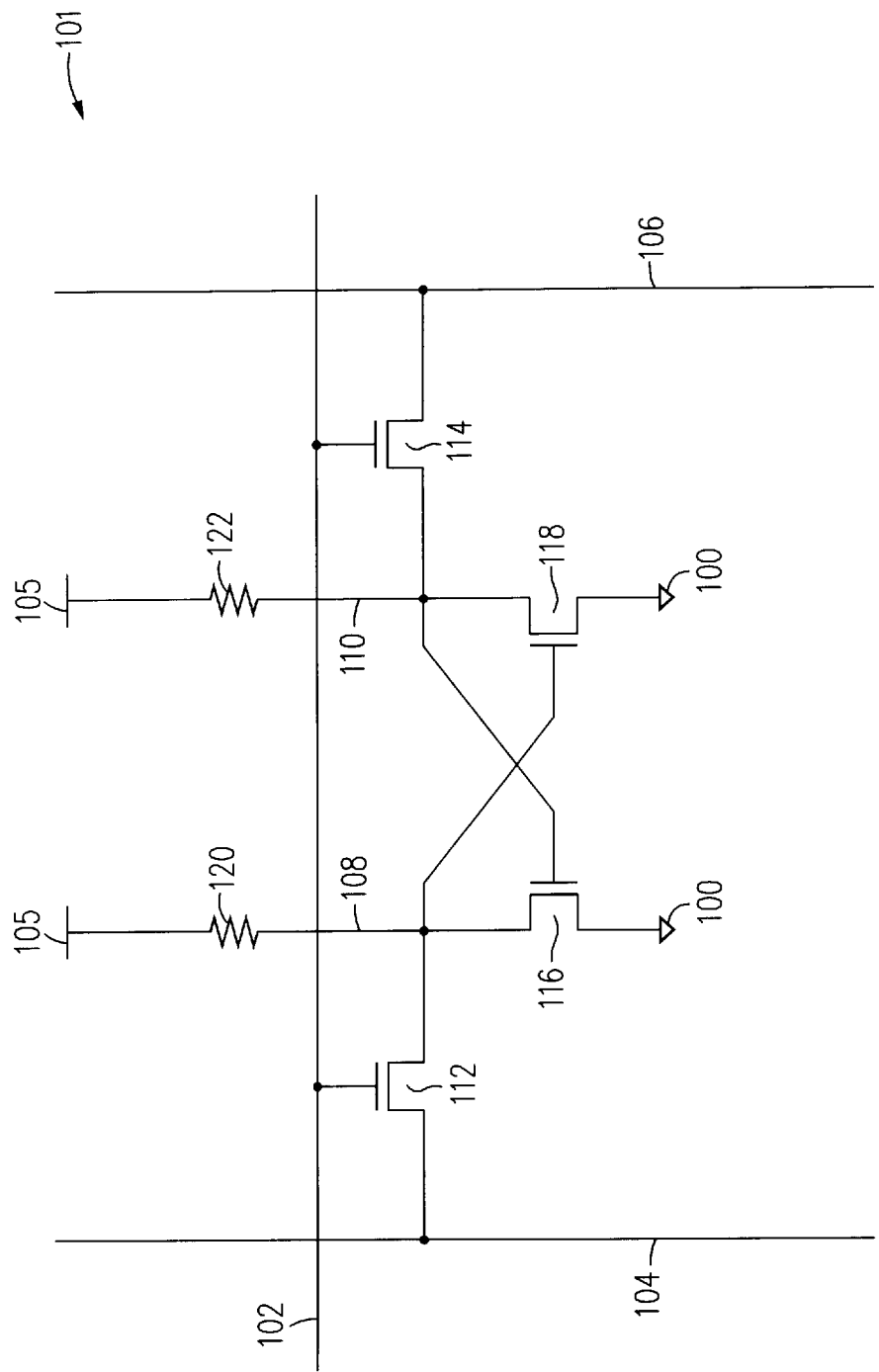
FIG. 1, labeled prior art, is a schematic diagram of a single-port "4T" static memory cell incorporating polysilicon load resistors.
Figure 2:
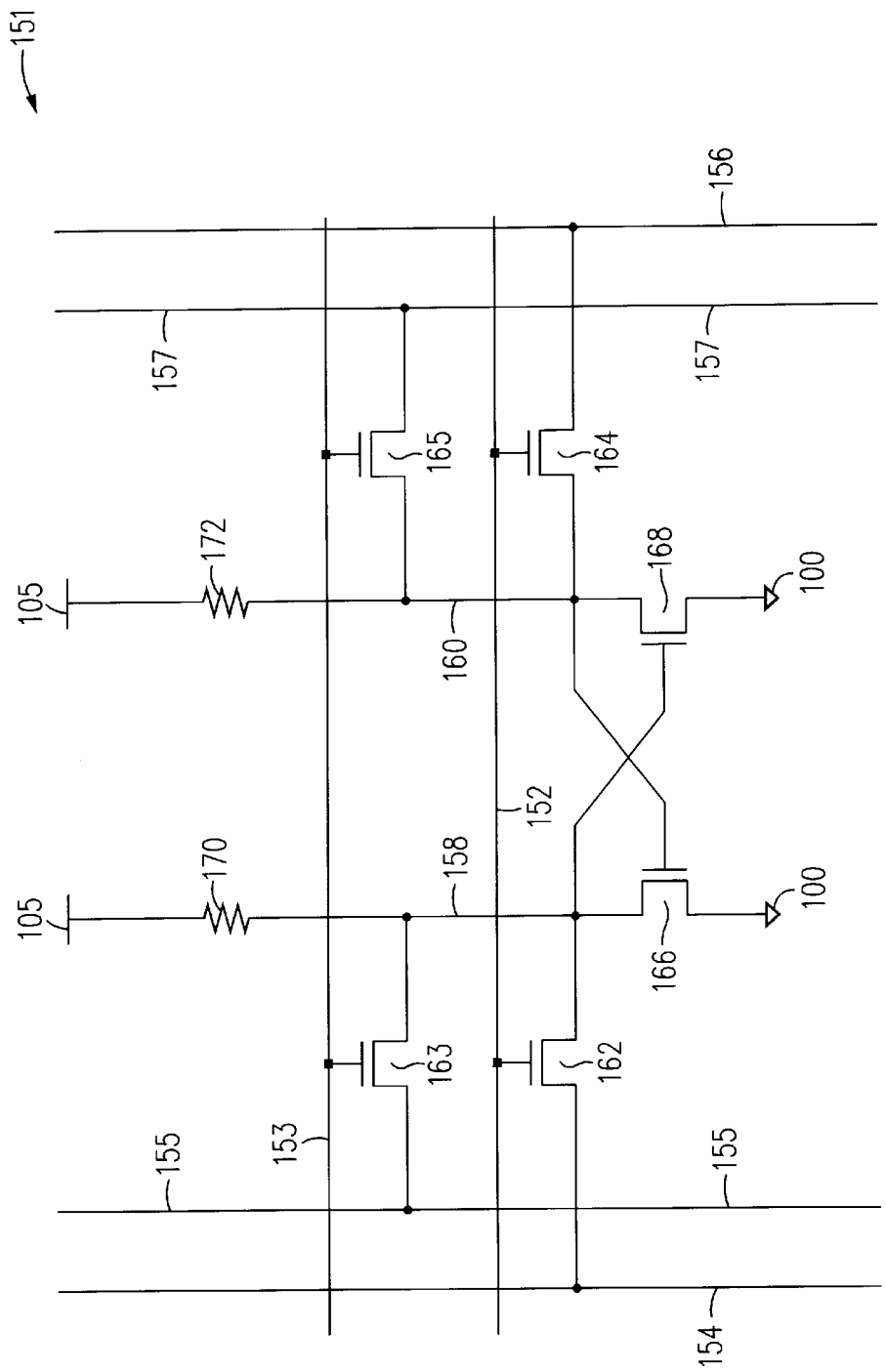
FIG. 2, labeled prior art, is a schematic diagram of a dual-port "4T" static memory cell incorporating polysilicon load resistors.
Figure 3:
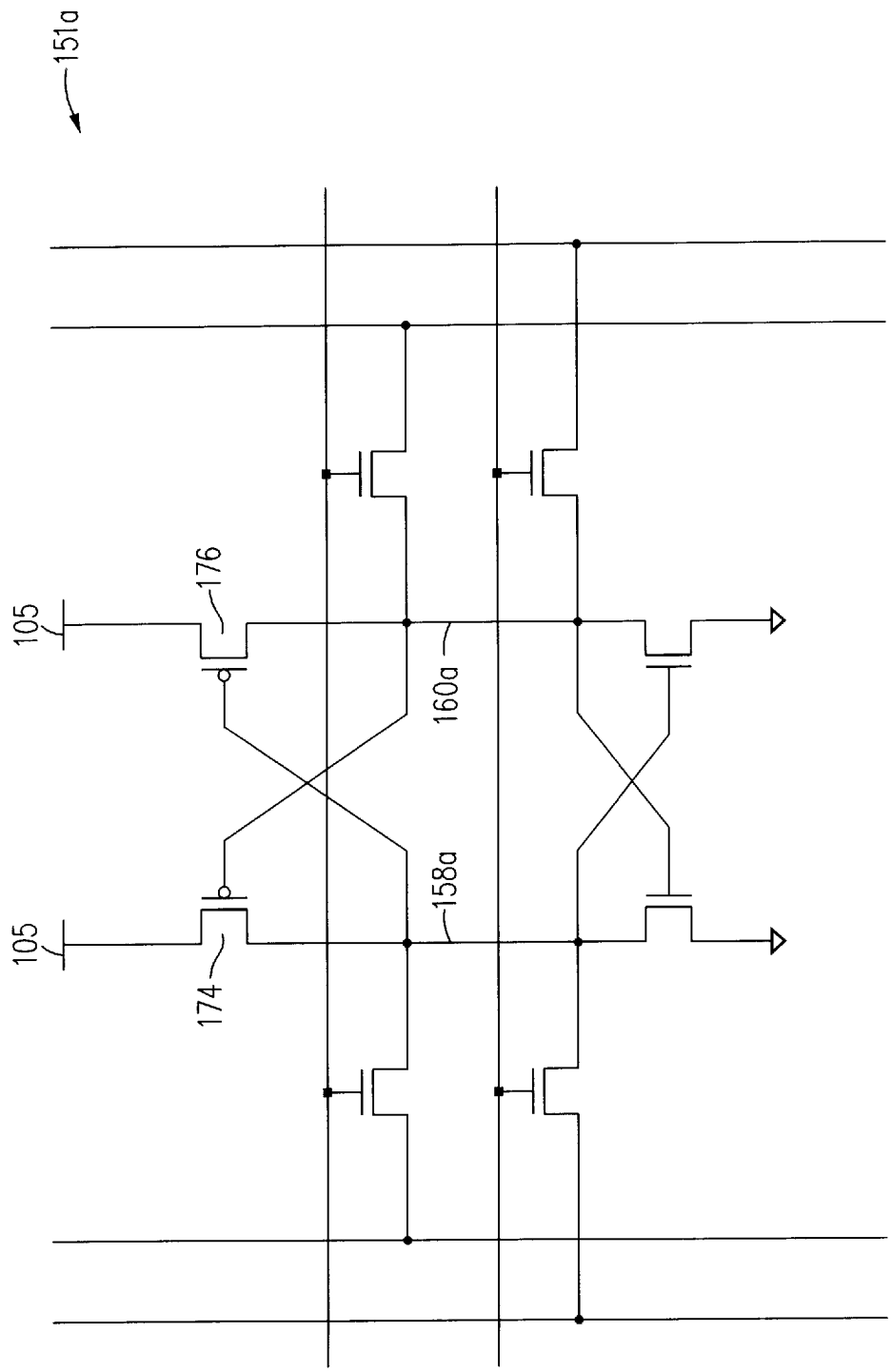
FIG. 3, labeled prior art, is a schematic diagram of a dual-port "6T" static memory cell incorporating P-channel transistors as load devices.
Figure 4:
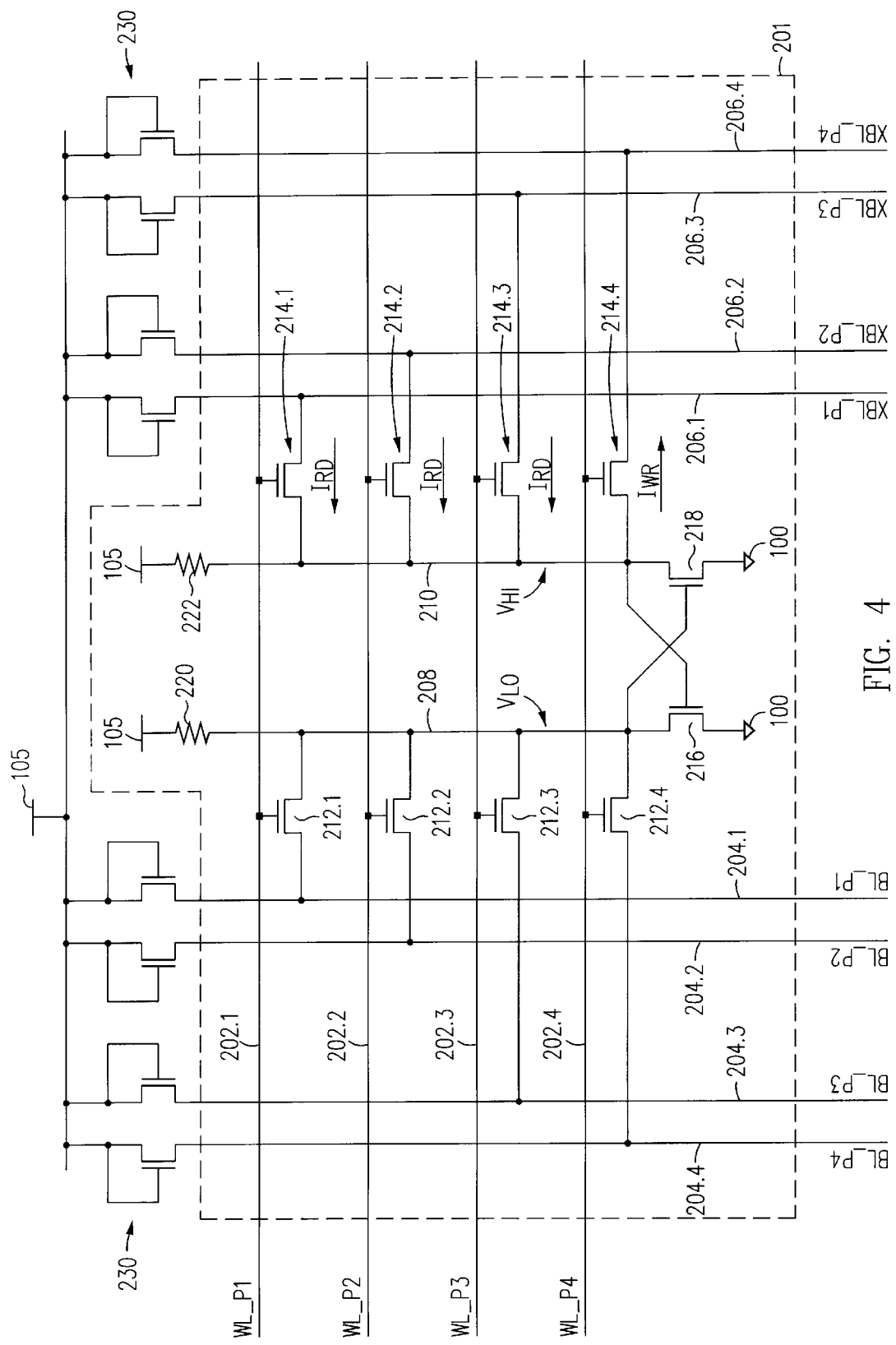
FIG. 4 is a schematic diagram of a four-port "4T" static memory cell incorporating polysilicon load resistors.
Figure 5:
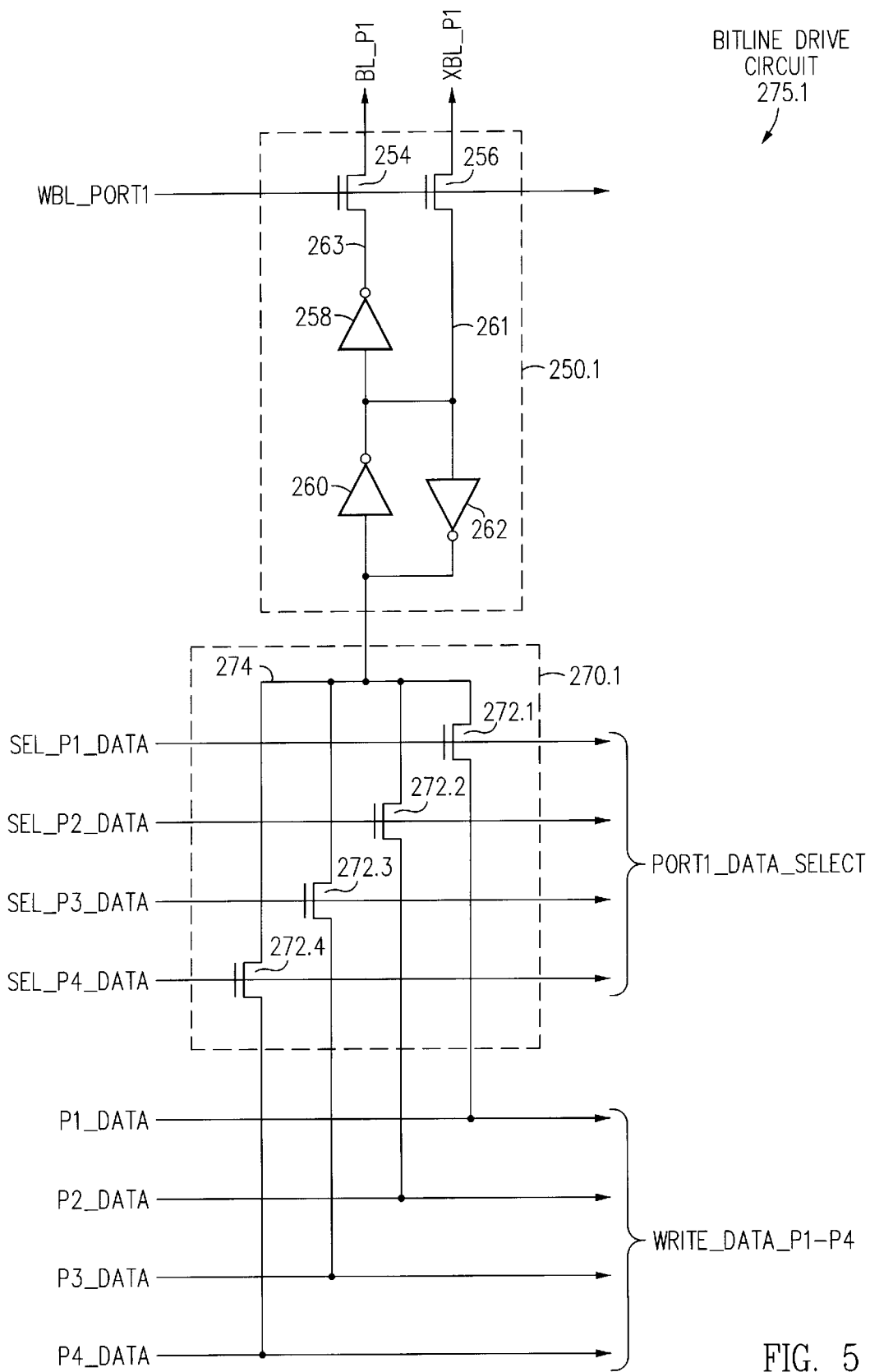
FIG. 5 is a schematic diagram of one embodiment of a bitline drive circuit useful for the present invention.

FIG. 5 is a schematic diagram of one embodiment of a bitline drive circuit which affords use of the other ports of a multi-port memory to assist another port in writing a memory cell. Whenever a read port accesses the same row as a write port, the read port is forced into a write along the same column bitlines as the write port's column bitlines. The bitline drive circuit 275.1 shown in FIG. 5 includes a selector 270.1 and a B/L driver 250.1. The selector 270.1 is used to select one of four available data lines corresponding to the write data for each of the four ports. The selected data is then provided to the B/L driver 250.1 and driven onto the bitline pair BL_P1 and XBL_P1. Four bitline drive circuits as shown in FIG. 5 are used to collectively drive each of the four bitline pairs of each physical column of the memory array, which will be discussed herebelow.

Selector 270.1 includes a transistor 272.1 which, when enabled by select line SEL_P1_DATA, couples the data value present on data line P1_DATA onto output node 274, which is then provided to B/L driver 250.1. Similarly, three additional transistors 272.2, 272.3, and 272.4 are individually enabled by respective select lines SEL_P2_DATA, SEL_P3_DATA, and SEL_P4_DATA to couple the logic value present on write data lines P2_DATA, P3_DATA, and P4_DATA, respectively, onto the output node 274. The B/L driver 250.1 includes inverters 258, 260, and 262, and pass transistors 254 and 256. Inverters 260 and 262 form a latch which is set whenever the selector 270.1 is enabled and drives the state of output node 274 (which momentarily overpowers the output of inverter 262) and which latch ensures a valid high or low level on node 274 when no select line is enabled (for stability as well as for power reduction). Inverter 258 receives the complement data signal on node 261 to create a buffered true data signal on node 263, which is then driven onto the bitline BL_P1 by pass transistor 254 when enabled by bitline write enable signal WBL_PORT1. Likewise, the buffered complement data signal on node 261 is driven onto the bitline XBL_P1 by pass transistor 256 when enabled by bitline write enable signal WBL_PORT1.

Figure 6:
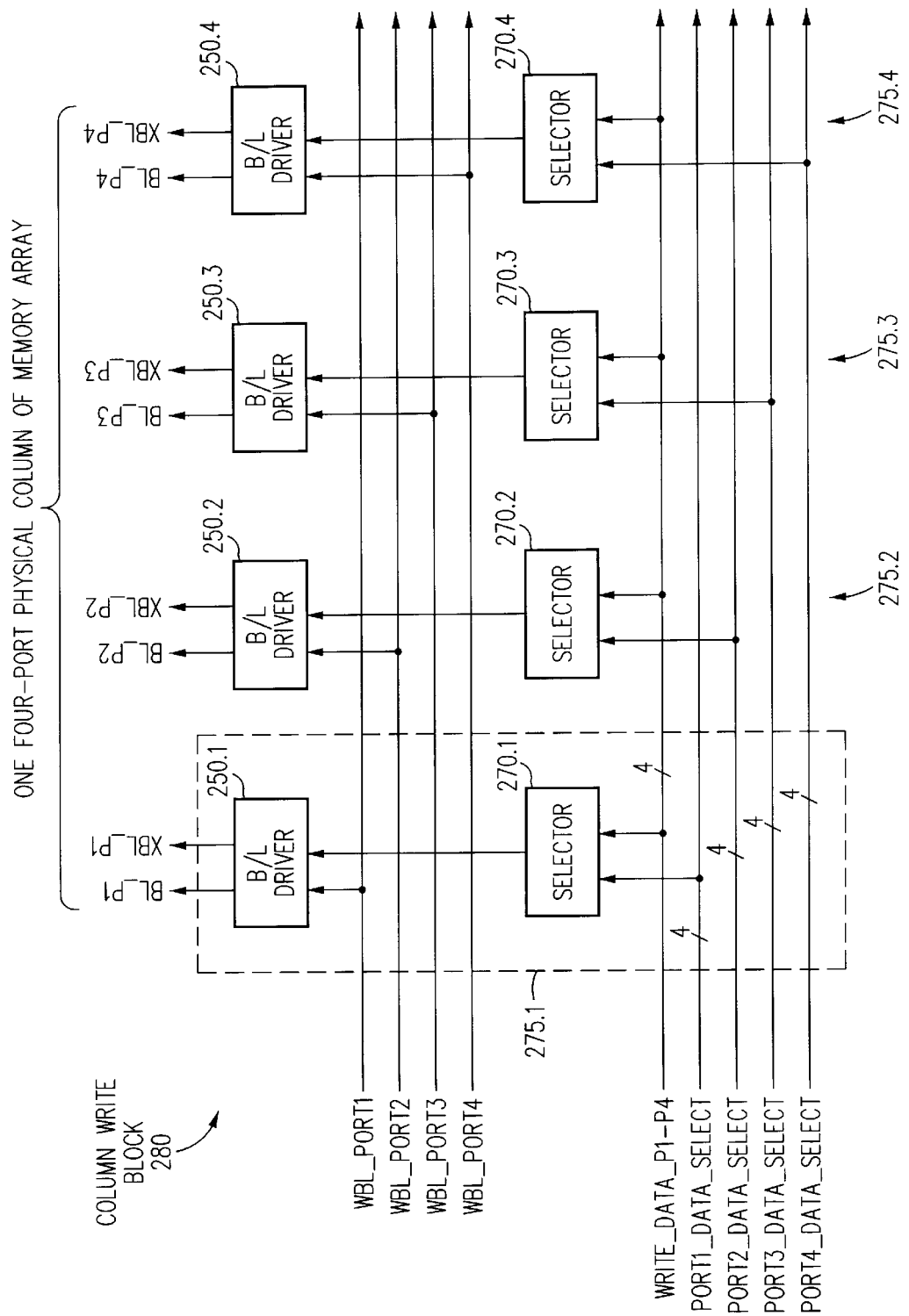
FIG. 6 is a schematic diagram of one embodiment of a column write block useful for the present invention.

This bitline drive circuit 275.1 is used for driving the bitlines of a column for a particular port, whether the port is writing to the column, or whether the port is otherwise reading from the column but is forced into a write condition in accordance with the present invention to eliminate multi-port row contention. A group of four bitline drive circuits 275.1, 275.2, 275.3, and 275.4 is shown in FIG. 6 which together form a column write block 280, and which provides the necessary interface for one physical column of four-port memory cells. Selector 270.1 receives data for all four ports conveyed on a bus WRITE_DATA_P1–P4 which is 4-bits wide. Further, selector 270.1 receives a group of four data select lines conveyed on a bus PORT1_DATA_SELECT, which is also four bits wide. Selector 270.1 then selects one of the four data values conveyed on the bus WRITE_DATA_P1–P4 and drives the selected data value onto a data input (i.e., node 274 in FIG. 5) of the associated B/L driver 250.1. The B/L driver 250.1 forms the complement data value and when enabled by the bitline write enable signal WBL_PORT1, the B/L driver 250.1 drives the true and complement data values onto bitlines BL_P1 and XBL_P1, respectively. As can be seen, the bitline drive block 275.1 affords the ability to drive the bitlines associated with port 1 (namely BL_P1 and XBL_P1) with a data value corresponding to any of the four ports for this physical column. If port 1 is a write port, obviously selector 270.1 is enabled to select data corresponding to port 1 (by enabling select line SEL_P1_DATA within the PORT1_DATA_SELECT bus) and to drive that data onto its bitlines which correspond to port 1. Alternatively, if port 1 is a "read" port (meaning a port which is either reading any column of the same row or writing a different column of the same row) and another port is writing to this same column, selector 270.1 is enabled to select data corresponding to that other port which is writing and to drive that data onto its port 1 bitlines, thus assisting the port which is writing and eliminating the row contention problem.

The bitline drive blocks for the other three ports are configured similarly to that described above for port 1. Selector 270.2 receives data for all four ports conveyed on the WRITE_DATA_P1–P4 bus, and receives a group of four data select lines conveyed on a 4-bit-wide PORT2_DATA_SELECT bus. Selector 270.2 then drives a data value selected from the WRITE_DATA P1–P4 bus onto a data input of the associated B/L driver 250.2, which then forms the complement data value and when enabled by the bitline write enable signal WBL_PORT2 drives the true and complement data values onto bitlines BL_P2 and XBL_P2, respectively. Selector 270.3 receives data for all four ports conveyed on the WRITE_DATA_P1–P4 bus, and receives a group of four data select lines conveyed on a 4-bit-wide PORT3_DATA_SELECT bus. Selector 270.3 then drives a data value selected from the WRITE_DATA_P1–P4 bus onto a data input of the associated B/L driver 250.3, which then forms the complement data value and when enabled by the bitline write enable signal WBL_PORT3 drives the true and complement data values onto bitlines BL_P3 and XBL_P3, respectively. Selector 270.4 receives data for all four ports conveyed on the WRITE_DATA P1–P4 bus, and receives a group of four data select lines conveyed on a 4-bit-wide PORT4_DATA_SELECT bus. Selector 270.4 then drives a data value selected from the WRITE_DATA_P1–P4 bus onto a data input of the associated B/L driver 250.4, which then forms the complement data value and when enabled by the bitline write enable signal WBL_PORT4 drives the true and complement data values onto bitlines BL_P4 and XBL_P4, respectively.

Figure 7:
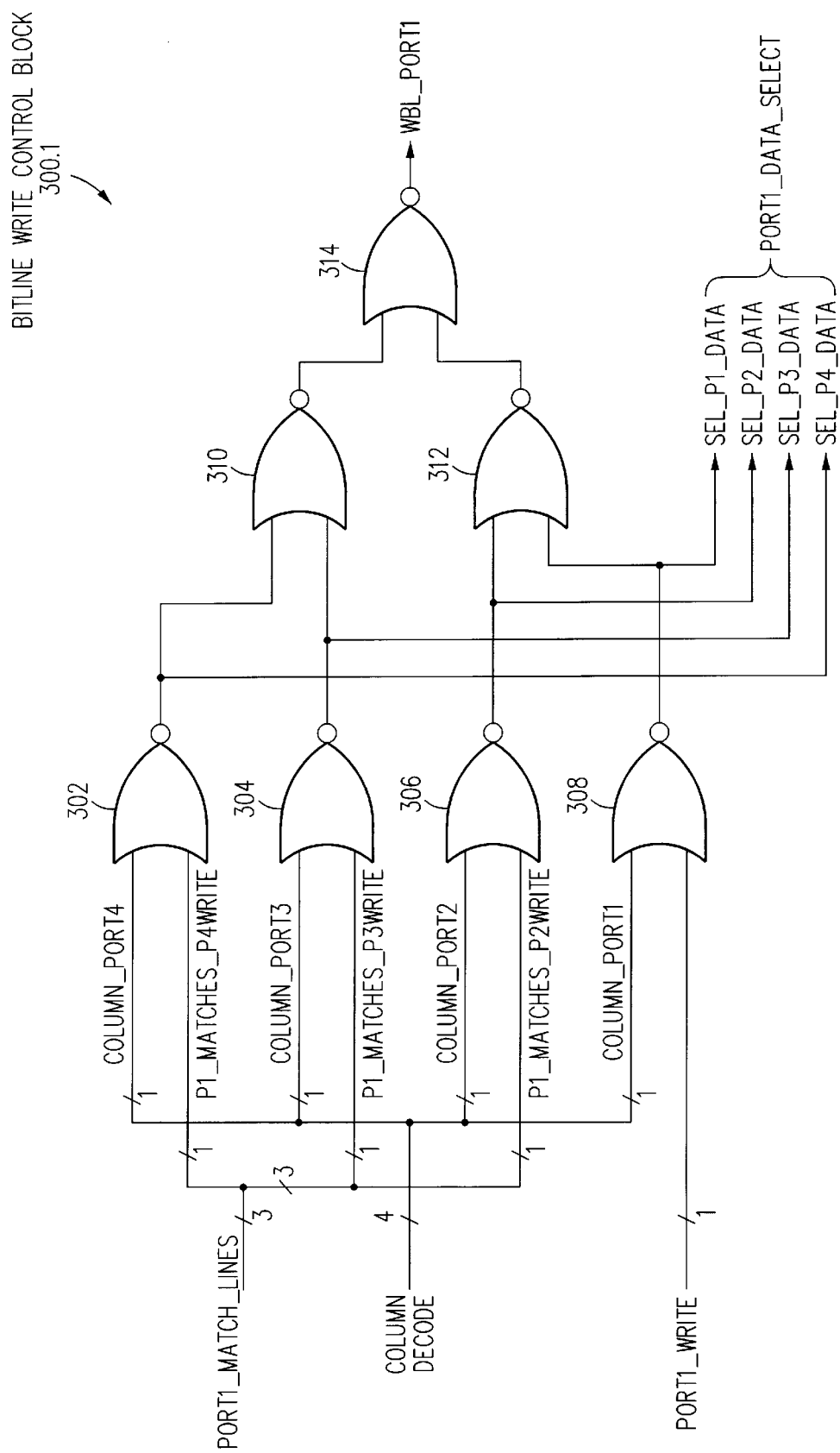
FIG. 7 is a schematic diagram of one embodiment of a bitline write control block useful for the present invention.

Referring now to FIG. 7, a bitline write control block 300.1 is shown which generates the various control signals received by the bitline drive circuit 275.1 associated with port 1 bitlines (as shown in FIGS. 5 and 6 and discussed above). Nor gate 308 is active (i.e., its output high) when the port 1 is itself a write port. Nor gate 308 receives an active-low COLUMN_PORT1 signal from a column decoder (not shown) indicating that the column associated with this bitline is the decoded column, and the nor gate 308 further receives an active-low write enable signal PORT1_WRITE to indicate that port 1 is writing. The output of nor gate 308 becomes the SEL_P1_DATA signal of the PORT1_DATA_SELECT bus. Furthermore, the output of nor gate 308 is provided to a group of nor gates 310, 312, and 314 which generate an active-high WBL_PORT1 signal when any one of the select lines of the PORT1_DATA_SELECT bus is active.

Additional nor gates 302, 304, and 306 are provided to generate control signals to drive data onto the port1 bitlines BL_P1 and XBL_P1 when another port is writing to the same column. Nor gate 306 is active when the port 2 is a write port. It receives an active-low COLUMN_PORT2 signal from a column decoder indicating that the column associated with this bitline is the decoded column for port 2, and the nor gate 306 further receives an active-low write enable signal P1_MATCHES_P2WRITE to indicate that port 2 is writing and that the port 1 row address matches the port 2 row address (with one exception to be discussed herebelow). The output of nor gate 306 becomes the SEL_P2_DATA signal of the PORT1_DATA_SELECT bus. Furthermore, the output of nor gate 306 is provided to the group of nor gates 310, 312, and 314 to generate the active-high WBL_PORT1 signal when the SEL_P2_DATA signal is active. Nor gate 304 is active when the port 3 is a write port. It receives an active-low COLUMN_PORT3 signal from a column decoder indicating that the column associated with this bitline is the decoded column for port 3, and the nor gate 304 further receives an active-low write enable signal P1_MATCHES_P3WRITE to indicate that port 3 is writing and that the port 1 row address matches the port 3 row address. The output of nor gate 304 becomes the SEL_P3_DATA signal of the PORT1_DATA_SELECT bus. Furthermore, the output of nor gate 304 is provided to the group of nor gates 310, 312, and 314 to generate the active-high WBL_PORT1 signal when the SEL_P3_DATA signal is active. Lastly, nor gate 302 is active when the port 4 is a write port. It receives an active-low COLUMN_PORT4 signal from a column decoder indicating that the column associated with this bitline is the decoded column for port 4, and the nor gate 302 further receives an active-low write enable signal P1_MATCHES_P4WRITE to indicate that port 4 is writing and that the port 1 row address matches the port 4 row address. The output of nor gate 302 becomes the SEL_P4_DATA signal of the PORT_DATA_SELECT bus. Furthermore, the output of nor gate 302 is provided to the group of nor gates 310, 312, and 314 to generate the active-high WBL_PORT1 signal when the SEL_P4_DATA signal is active. The group of lines P1_MATCHES_P2WRITE, P1_MATCHES_P3WRITE, and P1_MATCHES_P4WRITE may be called the "port 1 match lines" for this particular bitline write control block 300.1 and are conveyed on a PORT1_MATCH_LINES bus. As will be seen below, each bitline write control block receives a column decode signal for each of the four ports, a write enable signal for the port corresponding to the bitlines in question, and a group of three match lines corresponding to the other three ports.

Figure 8:
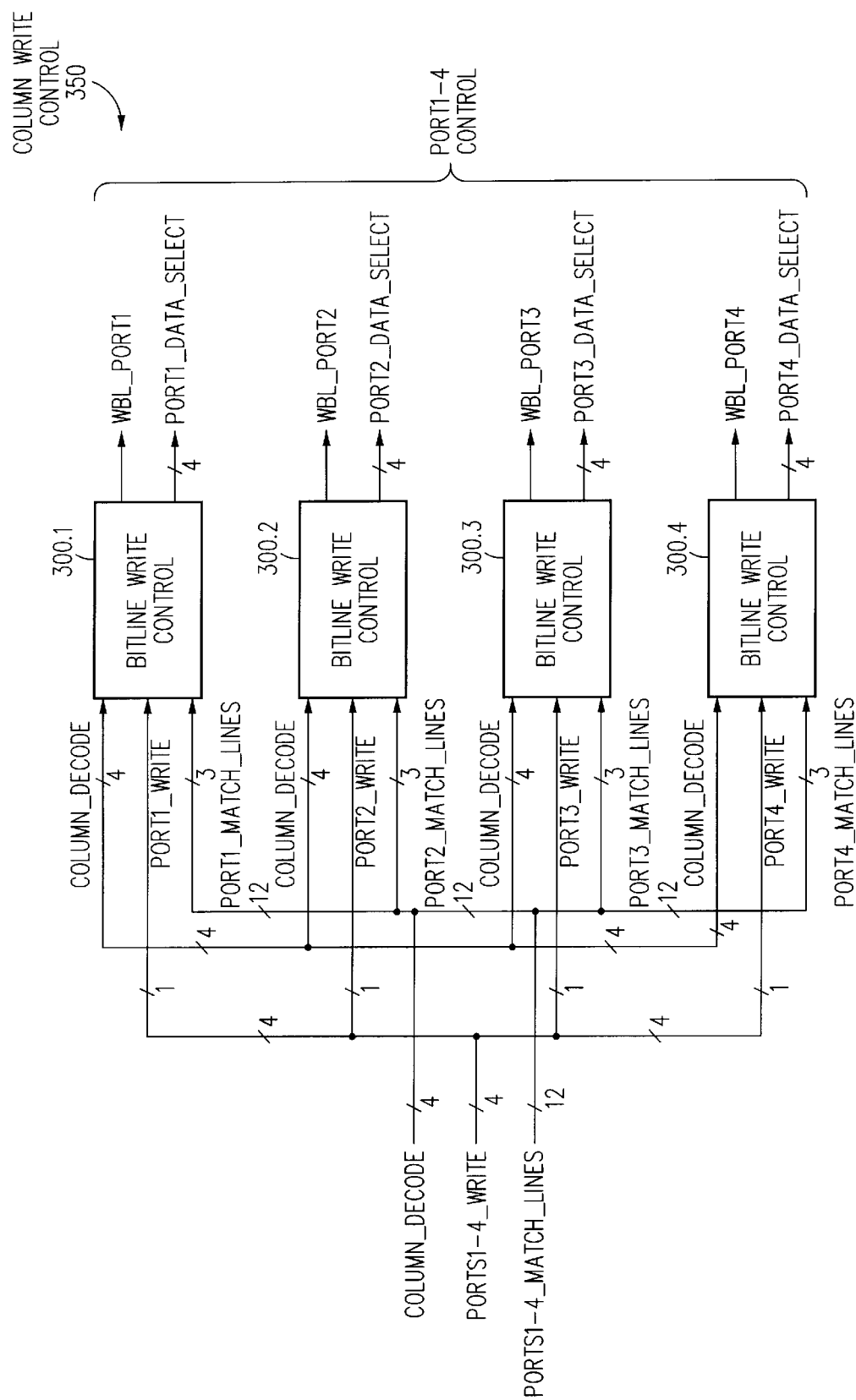
FIG. 8 is a schematic diagram of one embodiment of a column write control useful for the present invention.

Four bitline write control blocks (each like that shown in FIG. 7) are required to generate all the various control signals needed by the four ports of the column write block 280 shown in FIG. 6 (and which corresponds to one physical column in a four-port memory array). Referring now to FIG. 8, a column write control 350 includes the bitline write control 300.1 (discussed above) for generating the control signals for port 1, but also includes analogous bitline write controls 300.2, 300.3, and 300.4 for generating the control signals for port 2, port 3, and port 4, respectively. For example, bitline write control block 300.2 receives the same four-bit COLUMN_DECODE bus as did bitline write control block 300.1, which COLUMN_DECODE bus conveys an output for indicating whether a given column is selected by each of the four ports. The bitline write control block 300.2 also receives a PORT2_WRITE signal to indicate, when active, that port 2 is writing, and further receives a group of three "port 2 match lines" conveyed on the PORT2_MATCH_LINES bus to indicate that port 2 is writing and that one or more of the other ports has a row address which matches the port 2 row address. The bitline write control block 300.2 generates the four data select signals (SEL_P1_DATA, SEL_P2_DATA, SEL_P3_DATA, and SEL_P4_DATA) conveyed on the PORT2_DATA_SELECT bus, and also generates the WBL_PORT2 signal.

Similarly, bitline write control block 300.3 also receives the same four-bit COLUMN_DECODE bus as did bitline write control block 300.1. The bitline write control block 300.3 also receives a PORT3_WRITE signal to indicate, when active, that port 3 is writing, and further receives a group of three "port 3 match lines" conveyed on the PORT3_MATCH_LINES bus to indicate that port 3 is writing and that one or more of the other ports has a row address which matches the port 3 row address. The bitline write control block 300.3 then generates the four data select signals (SEL_P1_DATA, SEL_P2_DATA, SEL_P3_DATA, and SEL_P4_DATA) conveyed on the PORT3_DATA_SELECT bus, and also generates the WBL_PORT3 signal. Lastly, the bitline write control block 300.4 receives the same four-bit COLUMN_DECODE bus as did bitline write control block 300.1, receives a PORT4_WRITE signal to indicate, when active, that port 4 is writing, and further receives a group of three "port 4 match lines" conveyed on the PORT4_MATCH_LINES bus to indicate that port 4 is writing and that one or more of the other ports has a row address which matches the port 4 row address. The bitline write control block 300.4 then generates the four data select signals (SEL_P1_DATA, SEL_P2_DATA, SEL_P3_DATA, and SEL_P4_DATA) conveyed on the PORT4_DATA_SELECT bus, and also generates the WBL_PORT4 signal.

The PORT1_MATCH_LINES bus, the PORT2_MATCH_LINES bus, the PORT3_MATCH_LINES bus, and the PORT4_MATCH_LINES bus may be grouped into a single 12-bit-wide PORTS1–4_MATCH_LINES bus as indicated in FIG. 8. Also, the WBL_PORT1 signal and the select lines conveyed on the PORT1_DATA_SELECT bus, the WBL_PORT2 signal and the select lines conveyed on the PORT2_DATA_SELECT bus, the WBL_PORT3 signal and the select lines conveyed on the PORT3_DATA_SELECT bus, and the WBL_PORT4 signal and the select lines conveyed on the PORT4_DATA_SELECT bus may be referred together as a 20-bit-wide PORT1–4_CONTROL bus, as also shown in FIG. 8.

Figure 9:
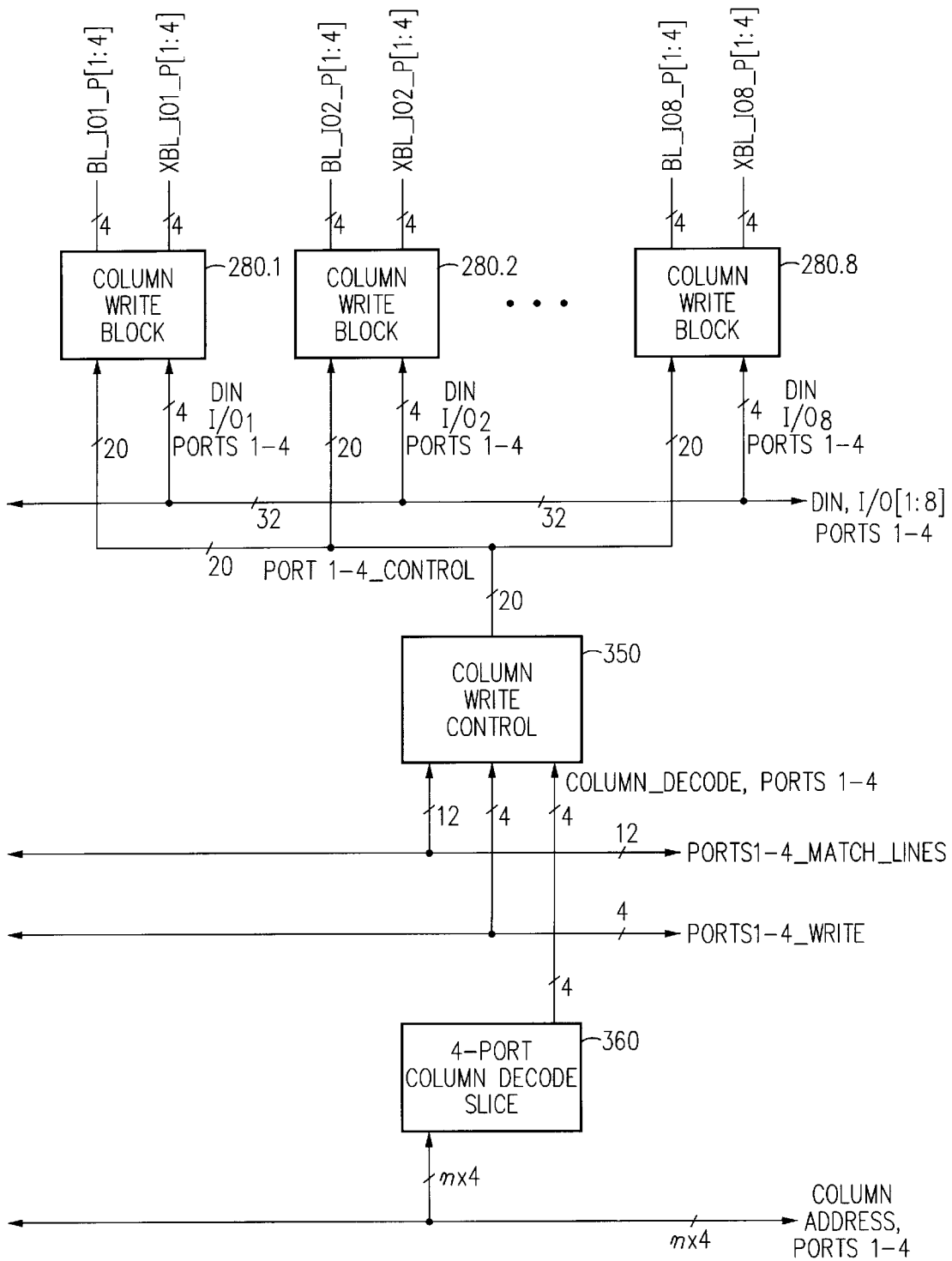
FIG. 9 is a schematic diagram of one embodiment of a logical column interface block useful for the present invention.

FIG. 9 illustrates an additional level of hierarchical structure in the column organization of an embodiment having eight I/O's, each having four ports. A four-port column decoder 360 receives four groups of n-bit column addresses on a COLUMN_ADDRESS bus, each group of column addresses for decoding the selected column for one of the four ports. The design of suitable column decoders is well known in the art and may be accomplished in a number of different ways with no particular advantage or detriment to the present invention. The column decode output for each of the ports is conveyed on the 4-bit-wide COLUMN_DECODE bus to the column write control 350 (previously discussed in relation to FIG. 8). Also received by the column write control 350 are the match lines conveyed on the 12-bit-wide PORTS1–4_MATCH_LINES bus and the four port write control lines PORT1_WRITE, PORT2_WRITE, PORT3_WRITE, and PORT4_WRITE conveyed on the PORTS1–4_WRITE bus.

The column write control 350 generates the various control signals conveyed on the 20-bit PORT1–4_CONTROL bus, which are all provided to each of eight column write blocks 280.1, 280.2, . . . 280.8 (only three of which are shown in FIG. 9). A 32-bit data bus includes an individual WRITE_DATA_P1–P4 bus for each of eight I/O's, and so carries a data value for each of eight I/Os, each having four ports. Column write block 280.1 receives four data bits corresponding to the four ports of I/O$_1$, column write block 280.2 receives four data bits corresponding to the four ports of I/O$_2$, and so forth up through column write block 280.8 which receives four data bits corresponding to the four ports of I/O$_8$. Together the eight column write blocks 280.1, 280.2, . . . , 280.8 support one logical column and include eight physical columns, each having four ports, for a total of thirty-two bitline pairs in the memory array. In particular, the column write block 280.1 is coupled to a physical column of the memory array having four ports: four true bitlines BL_I/O1_P[1:4] and four complement bitlines XBL_I/O1_P[1:4]. Each of the other column write blocks is similarly coupled to four true bitlines and four complement bitlines corresponding to each of the other seven I/Os, as shown in FIG. 9.

Figure 10:
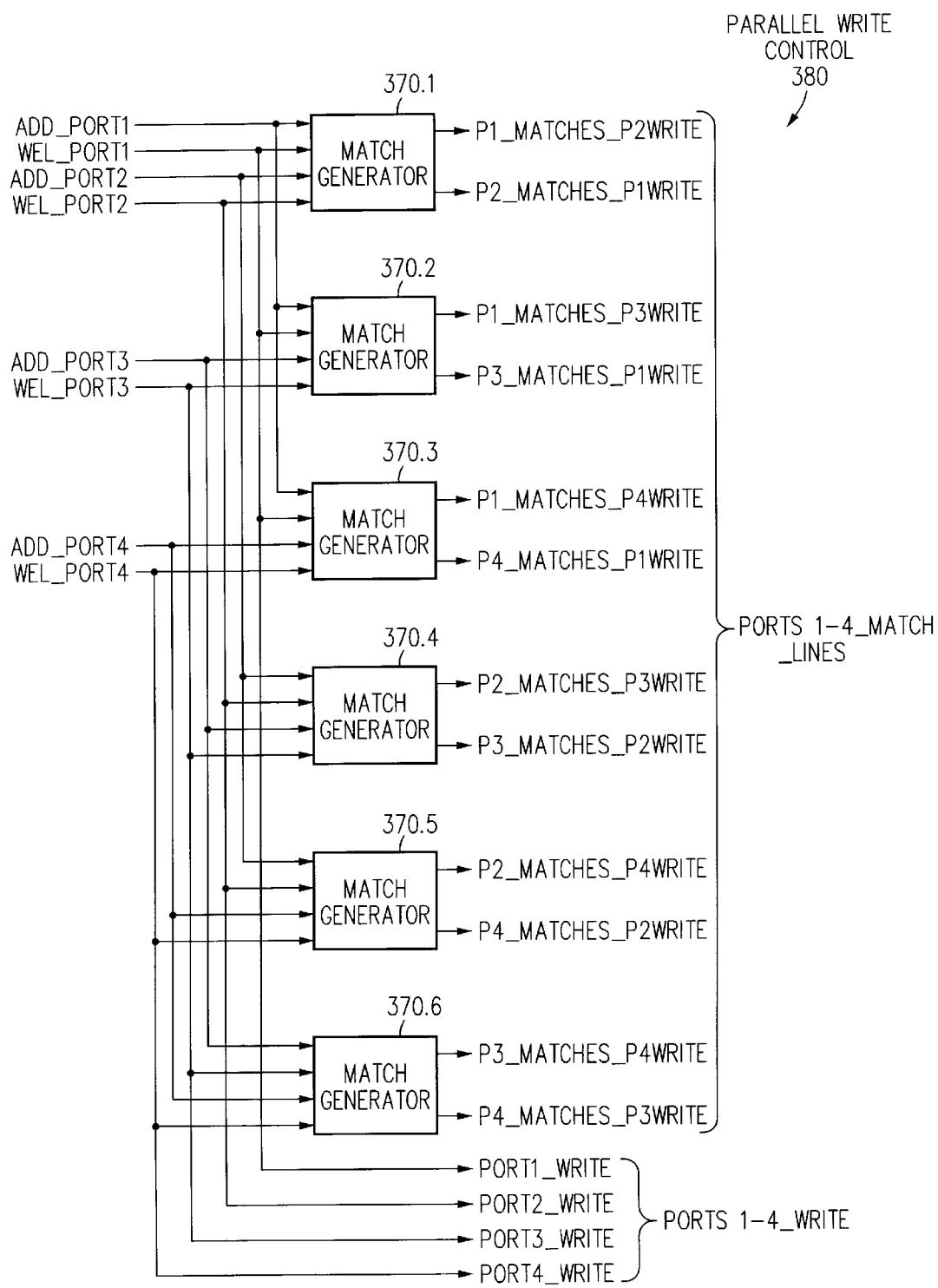
FIG. 10 is a schematic diagram of one embodiment of a parallel write control useful for the present invention.

The twelve match line signals conveyed on the PORTS1–4_MATCH_LINES bus are generated by the parallel write control 380 shown in FIG. 10. A group of six match generators 370.X compare the addresses used for each of the four ports and generate the required match lines discussed above. For example, match generator 370.1 receives the port 1 address conveyed on an ADD_PORT1 bus, a port 1 write enable signal WEL_PORT1, the port 2 address conveyed on an ADD_PORT2 bus, and a port 2 write enable signal WEL_PORT2, and generates the two match lines P1_MATCHES_P2WRITE and P2_MATCHES_P1WRITE. Match generator 370.2 receives the port 1 address conveyed on the ADD_PORT1 bus, the port 1 write enable signal WEL_PORT1, the port 3 address conveyed on an ADD_PORT3 bus, and a port 3 write enable signal WEL_PORT3, and generates the two match lines P1_MATCHES_P3WRITE and P3_MATCHES_P1WRITE. Match generator 370.3 receives the port 1 address conveyed on the ADD_PORT1 bus, the port 1 write enable signal WEL_PORT1, the port 4 address conveyed on an ADD_PORT4 bus, and a port 4 write enable signal WEL_PORT4, and generates the two match lines P1_MATCHES_P4WRITE and P4_MATCHES_P1WRITE. Match generator 370.4 receives the port 2 address conveyed on the ADD_PORT2 bus, the port 2 write enable signal WEL_PORT2, the port 3 address conveyed on the ADD_PORT3 bus, and the port 3 write enable signal WEL_PORT3, and generates the two match lines P2_MATCHES_P3WRITE and P3_MATCHES_P2WRITE. Match generator 370.5 receives the port 2 address conveyed on the ADD_PORT2 bus, the port 2 write enable signal WEL_PORT2, the port 4 address conveyed on the ADD_PORT4 bus, and the port 4 write enable signal WEL_PORT4, and generates the two match lines P2_MATCHES_P4WRITE and P4_MATCHES_P2WRITE Lastly, match generator 370.6 receives the port 3 address conveyed on the ADD_PORT3 bus, the port 3 write enable signal WEL_PORT3, the port 4 address conveyed on the ADD_PORT4 bus, and the port 4 write enable signal WEL_PORT4, and generates the two match lines P3_MATCHES_P4WRITE and P4_MATCHES_P3WRITE. The entire group of all twelve match lines together are conveyed on the 12-bit-wide PORTS1–4_MATCH_LINES bus. Moreover, the individual write enable signals WEL_PORT1, WEL_PORT2, WEL_PORT3, and WEL_PORT4 are also conveyed to other circuit blocks on the PORT1–4_WRITE bus.

Figure 11:
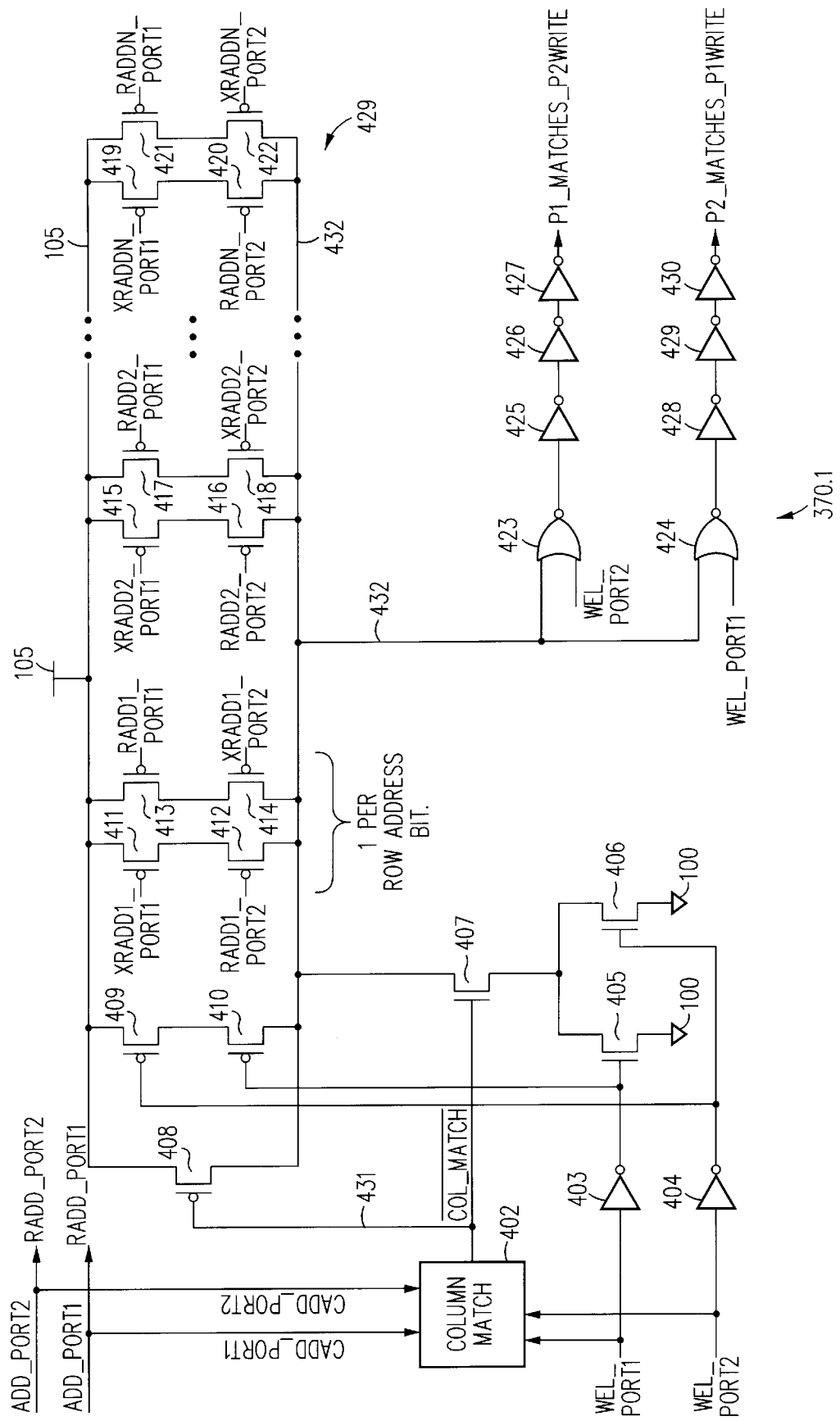
FIG. 11 is a schematic diagram of one embodiment of a match generator useful for the present invention.

One particular embodiment of the match generator 370.1 is shown in FIG. 11. The WEL_PORT1 signal, which is active low whenever port 1 is writing, is received by an inverter 403 and by a column match circuit 402. Likewise, the WEL_PORT2 signal, which is active low whenever port 2 is writing, is received by an inverter 404 and by the column match circuit 402. The outputs of inverter 403 and inverter 404 are coupled to the respective gate terminals of N-channel transistors 405 and 406, and which transistors serve to power up the comparator block 429 whenever either port 1 or port 2 is writing. The outputs of inverter 403 and inverter 404 are also coupled to the respective gate terminals of P-channel transistors 409 and 410 which serve to hold comparator node 432 in an inactive state (here a high logic level) when neither port 1 or port 2 is writing. Column match circuit 402 receives the column portion of the addresses for both port 1 and for port 2 and generates a COL_MATCH signal on node 431 which is active low when both port 1 and port 2 are writing and the two column addresses match. Alternatively, if the column addresses do not match, or when only one or neither port is writing, then a high voltage on the gate terminal of both transistor 408 and transistor 407 allows the comparator block 429 to power up. When conductive, transistor 407 also serves to limit the current drawn through transistors 405 and 406.

Referring now to the comparator block 429, a group of four P-channel transistors are used to accomplish a bit-by-bit comparison for each bit of the row address portions of the port 1 address and the port 2 address. If any row address bit within the port 1 address differs from the respective row address bit within the port 2 address, then comparator node 432 is driven high by a series combination of two P-channel transistors. Alternatively, if no row address bit within the port1 address differs from the respective row address bit within the port 2 address (i.e., the two row addresses match), then comparator node 432 is driven low by the series combination of N-channel transistor 407 and one or both of N-channel transistors 405 and 406 (assuming that at least one of the ports is writing and also that, if both ports are writing, that the column addresses do not match, all as described above). Thus, comparator node 432 is active low whenever: (1) the row addresses match; and (2) one or both of the ports is writing; and (3) if both ports are writing, the column addresses do not match.

The operation of the comparator block 429 may be appreciated more fully by detailed analysis of P-channel transistors 411, 412, 413, and 414. The gate terminal of transistor 411 is driven (for the example shown) by signal XRADD1_PORT1, which is the complement row address, bit 1, presented to port 1. Similarly, the gate terminal of transistor 412 is driven by signal RADD1_PORT2, which is the row address, bit 1, presented to port 2. The gate terminal of transistor 413 is driven by signal RADD1_PORT1, which is the true row address, bit 1, presented to port 1. Similarly, the gate terminal of transistor 414 is driven by signal XRADD1_PORT2, which is the complement row address, bit 1, presented to port 2. If the row addresses for bit 1 for port 1 does not match that for port 2, and if XRADD1_PORT1 and RADD1_PORT2 are both low, then both transistors 411 and 412 will be turned on and will drive the voltage of comparator node 432 to a high level which indicates the row addresses do not match. Alternatively, if the row addresses for bit I for port 1 still does not match that for port 2, but if RADD1_PORT1 and XRADD1_PORT2 are both low, then both transistors 413 and 414 will be turned on and will drive the voltage of comparator node 432 to a high level. The comparator node 432 will be driven to a high level if either the series combination of transistors 411 and 412 or the series combination of transistors 413 and 414 is conductive. Neither series combination will be conductive if the bit 1 addresses are the same for both port 1 and for port 2, because in this case only one transistor in each series combination will be conductive at any one time.

A quad of transistors is provided for each bit of the row addresses to be compared in comparator block 429. The gate terminal of P-channel transistors 415, 416, 417, and 418 is connected to respective signals XRADD2_PORT 1, RADD2_PORT2, RADD2_PORT 1, and XRADD2_PORT2 to compare bit 2 of the row addresses. The gate terminal of P-channel transistors 419, 420, 421, and 422 is connected to respective signals XRADDN_PORT 1, RADDN_PORT2, RADDN_PORT 1, and XRADDN_PORT2 to compare bit "N" of the row addresses. The comparator node 432 will be driven to a high level if any one of the series combinations of P-channel transistors within comparator block 429 is conductive. None of the series combinations of P-channel transistors (transistors 411/412, transistors 415/416, etc.) will be conductive if all of the bits of the row addresses are the same for both port 1 and for port 2, in which case the comparator node 432 is driven low by the switched load transistors 407, 405, and 406 to indicate matching row addresses.

The active low WEL_PORT2 signal and the comparator node 432 are received by a nor gate 423 which drives its output high when the row addresses match and when port 2 is writing (as long as the columns do not match, as discussed above). Three inverters 425, 426, and 427 buffer the output of nor gate 423 to generate the P1_MATCHES_P2WRITE signal, which indicates, when active low, that: 1) port 2 is writing; 2) that the port 1 row address matches the port 2 row address; and 3) that the port 1 column address does not match the port 2 column address. The active low WEL_PORT1 signal and the comparator node 432 are received by a nor gate 424 which drives its output high when the row addresses match and when port 1 is writing (as long as the columns do not match, as discussed above). Three inverters 428, 429, and 430 buffer the output of nor gate 424 to generate the P2_MATCHES_P1WRITE signal, which indicates, when active low, that: 1) port 1 is writing; 2) that the port 1 row address matches the port 2 row address; and 3) that the port 1 column address does not match the port 2 column address. As used and intended herein, a port 1 selected row matches a port 2 selected row when the port 1 row address matches the port 2 row address. Likewise, a port 1 selected column matches a port 2 selected column when the port 1 column address matches the port 2 column address.

The column match block 402 may be implemented in a variety of ways, as long as the COL_MATCH output signal is active low whenever the port 1 column address matches the port 2 column address and both port 1 and port 2 are writing. As shown in FIG. 11, the column match block 402 receives the write enable signals WEL_PORT1 and WEL_PORT2 to minimize power consumption when neither port is writing, and to allow the COL_MATCH output signal to be driven active low whenever the port 1 column address matches the port 2 column address and both port 1 and port 2 are writing. The column match block 402 may be implemented using an analogous circuit as that shown in FIG. 11 for the remainder of the match generator 370.1, or using any other suitable circuit. The column match block 402 is used to detect when two ports attempt to write to the same column and serves to disable the various "match lines," and thus prevents the operation of a parallel write on either port. This disabling is performed to ensure the logical consistency of the column drive circuits (that only one data select line such as SEL_P1_DATA is ever active for a given bitline at a time) when two ports each attempt to write to the same memory cell.

Referring again to the parallel write control 380 shown in FIG. 10, each of match generators 370.2, 370.3, 370.4, 370.5, and 370.6 are identical in structure to the match generator 370.1 shown in FIG. 11. The difference between the six different match generators involves the specific pair of ports that each match generator compares, and the individual pair of generated signals corresponding thereto.

It should be appreciated by one skilled in the art that, while particular embodiments useful for a memory array having a four-port byte-wide column organization have been disclosed and discussed herein, modifications may be made and the teachings of this invention may be readily applied to any organization of multi-port memory arrays having any number of ports and any number of output bits, including dual port memory arrays. Furthermore, memory arrays as disclosed herein may be incorporated into stand-alone memory components intended for sale and use as individual memory components, as well as for memory arrays incorporated within a larger semiconductor system or subsystem, including, without limitation, a microprocessor, a video RAM a FIFO, a DMA channel controller, a high speed network elasticity buffer, a cross-point switch, and a switching hub for a data network. Consequently, it is therefore intended to cover in the appended claims all such changes and modifications which fall within the true spirit and scope of the invention, and which is defined in the appended claims.

What is claimed is:

1. In a memory array having a first port capable of writing a first memory cell corresponding to an address presented to the first port with write data presented to the first port, and having a second port capable of writing a second memory cell corresponding to an address presented to the second port with write data presented to the second port, said memory array comprising a plurality of physical columns of cells, each physical column including a first and a second differential bitline pair corresponding respectively to the first and second ports of each memory cell connected thereto and located within the physical column, a column interface circuit for a physical column of the array comprising:

a first selector circuit having a first input coupled to a data line conveying the write data presented to the first port, having a second input coupled to a data line conveying the write data presented to the second port, and having an output;

a second selector circuit having a first input coupled to a data line conveying the write data presented to the first port, having a second input coupled to a data line conveying the write data presented to the second port, and having an output;

a first bitline driver circuit having an input coupled to the output of the first selector circuit, and having a pair of complementary outputs respectively coupled to the first differential bitline pair within the physical column; and a second bitline driver circuit having an input coupled to the output of the second selector circuit, and having a pair of complementary outputs respectively coupled to the second differential bitline pair within the physical column.

2. In a memory array having a first port capable of writing a first memory cell corresponding to an address presented to the first port with write data presented to the first port, and having a second port capable of writing a second memory cell corresponding to an address presented to the second port with write data presented to the second port, said memory array comprising a plurality of physical columns of cells, each physical column including a first and a second differential bitline pair corresponding respectively to the first and second ports of each memory cell connected thereto and located within the physical column a column interface circuit for a physical column of the array comprising:

a first selector circuit for selecting write data presented to one of the first port and the second port;

a second selector circuit for selecting write data presented to one of the first port and the second port;

a first bitline driver circuit responsive to the first selector circuit, said first bitline driver circuit for driving the first bitline pair in accordance with write data selected by the first selector circuit; and a second bitline driver circuit responsive to the second selector circuit, said second bitline driver circuit for driving the second bitline pair in accordance with write data selected by the second selector circuit.

3. A column interface circuit as in claim 1 wherein the first selector circuit comprises:

a first transistor coupling the first input of the first selector circuit to the output of the first selector circuit, and having a gate terminal coupled to a first individual select signal line; and a second transistor coupling the second input of the first selector circuit to the output of the first selector circuit, and having a gate terminal coupled to a second individual select signal line.

4. A column interface circuit as in claim 3 wherein the second selector circuit comprises:

a third transistor coupling the first input of the second selector circuit to the output of the second selector circuit, and having a gate terminal coupled to a third individual select signal line; and a fourth transistor coupling the second input of the second selector circuit to the output of the second selector circuit, and having a gate terminal coupled to a fourth individual select signal line.

5. A column interface circuit as in claim 1 wherein the first bitline driver circuit comprises:

a first latch having an input coupled to the input of the first bitline driver circuit, and having an output;

a first inversion circuit having an input coupled to the output of the first latch, and having an output;

a first pass transistor coupling the input of the first inversion circuit to a first one of the first bitline driver circuit complementary output pair; and a second pass transistor coupling the output of the first inversion circuit to a second one of the first bitline driver circuit complementary output pair.

6. A column interface circuit as in claim 5 wherein the second bitline driver circuit comprises:

a second latch having an input coupled to the input of the second bitline driver circuit, and having an output;

a second inversion circuit having an input coupled to the output of the second latch, and having an output;

a third pass transistor coupling the input of the second inversion circuit to a first one of the second bitline driver circuit complementary output pair; and a fourth pass transistor coupling the output of the second inversion circuit to a second one of the second bitline driver circuit complementary output pair.

7. A column interface circuit as in claim 2 wherein the first selector circuit comprises:

a first transistor for coupling, when enabled by a first individual select signal, the write data presented to the first port, to the first bitline driver circuit; and a second transistor for coupling, when enabled by a second individual select signal, the write data presented to the second port, to the first bitline driver circuit.

8. A column interface circuit as in claim 7 wherein the second selector circuit comprises:

a third transistor for coupling, when enabled by a third individual select signal, the write data presented to the first port, to the second bitline driver circuit; and a fourth transistor for coupling, when enabled by a fourth individual select signal, the write data presented to the second port, to the second bitline driver circuit.

9. A column interface circuit as in claim 2 wherein the first bitline driver circuit comprises:

a first inversion circuit for generating both true and complement data from the selected write data coupled to the first bitline driver circuit by the first selector circuit; and a first pair of pass transistors for coupling the true and complement data from the first inversion circuit onto respective true and complement bitlines connected to the first bitline driver circuit.

10. A column interface circuit as in claim 9 wherein the first bitline driver circuit further comprises:

a first latch for latching the selected write data coupled to the first bitline driver circuit by the first selector circuit.

11. A column interface circuit as in claim 9 wherein the second bitline driver circuit comprises:

a second inversion circuit for generating both true and complement data from the selected write data coupled to the second bitline driver circuit by the second selector circuit; and a second pair of pass transistors for coupling the true and complement data from the second inversion circuit onto respective true and complement bitlines connected to the second bitline driver circuit.

12. A column interface circuit as in claim 11 wherein the second bitline driver circuit further comprises:

a second latch for latching the selected write data coupled to the second bitline driver circuit by the second selector circuit.

13. In a memory array having a first port and a second port, a column interface circuit for a physical column of the memory array, said column interface circuit comprising:

first means for driving a first bitline pair in accordance with data presented to the first port, said first bitline pair normally associated with the first port and located within the physical column;

second means for determining if a row address presented to the first port matches a row address presented to the second port and a column address presented to the first port does not match a column address presented to the second port; and third means for driving, if the row address presented to the first port matches the row address presented to the second port and the column address presented to the first port does not match the column address presented to the second port, a second bitline pair in accordance with the data presented to the first port, said second bitline pair located within the physical column and normally associated with the second port.

14. A column interface circuit as in claim 13 wherein the third means comprises:

selector means for selecting write data corresponding to one of the first port and the second port; and driver means responsive to the second selector means, said driver means for driving the second bitline pair in accordance with write data selected by the selector means.

15. A column interface circuit as in claim 14 wherein the driver means comprises:

latch means for latching the selected write data coupled thereto;

inversion means for generating both true and complement data from the selected write data; and pass transistor means for coupling the true and complement data onto respective true and complement bitlines connected thereto.

16. In a multi-port memory array having a plurality of memory cells arranged in physical rows and columns, said array having a plurality of ports each capable of accessing a respectively-addressed memory cell within the memory array, said array organized into logical columns addressed by a column address presented to the array, each logical column comprising at least one physical column of memory cells, each physical column within a single logical column corresponding to one bit within a word-width of the memory array, each physical column of memory cells having a plurality of bitline pairs for communicating therewith, each respective bitline pair within a physical column corresponding to a respective one of said plurality of ports, a column interface circuit comprising:

a plurality of selector circuits, each associated with a respective bitline pair of an associated physical column, for selecting a data value from among a plurality of write data values corresponding respectively to the plurality of ports; and a plurality of bitline driver circuits, each responsive to a respective selector circuit, for driving the respective bitline pair in accordance with the selected data value provided by the respective selector circuit.

17. A column interface circuit as in claim 16 wherein each of the plurality of selector circuits comprises an input for receiving a data select signal, said data select signal for indicating which data value to select from among the plurality of write data values coupled thereto.

18. A column interface circuit as in claim 17 wherein each of the plurality of bitline driver circuits comprises an input for receiving a port write control signal for controlling whether to drive a selected data value onto the respective bitline pair coupled thereto.

19. A column interface circuit as in claim 18 further comprising:

a column write control circuit for each logical column within the memory array, each of said column write control circuits comprising a plurality of bitline write control blocks, each bitline write control block corresponding to a respective one of the plurality of ports accessing the logical column, each bitline write control block for generating the respective port write control signal for each respective bitline driver circuit within the logical column which is associated with the respective port, and for generating the respective data select signal for each respective select circuit within the logical column which is associated with the respective port.

20. A column interface circuit as in claim 19 wherein the respective data select signal for each respective selector circuit comprises a plurality of individual select signals, each for selecting, when enabled, a particular one of the plurality of data values presented to the respective selector circuit.

21. A column interface circuit as in claim 20 wherein each of the plurality of selector circuits comprises a plurality of transistors, each for coupling, when enabled by a respective one of the plurality of individual select signals, a respective data value to an output of the selector circuit.

22. A column interface circuit as in claim 18 wherein each of the plurality of bitline driver circuits comprises:

a latch for latching the selected data value coupled thereto;

an inversion circuit for generating both true and complement data from the selected data value; and a pair of pass transistors for coupling the true and complement data onto respective true and complement bitlines connected thereto.

23. A column interface circuit as in claim 22 wherein a gate terminal of each of the pair of pass transistors is coupled to the respective port write control signal received by the respective bitline driver circuit.

24. A column interface circuit as in claim 20 wherein each of the bitline write control blocks comprises a circuit for activating its associated port write control signal whenever any of the individual select signals of the respective data select signal is active.

25. A column interface circuit as in claim 19 wherein:

each of the logical columns of the memory array includes only one physical column; and the word-width of the memory array is equal to 1 bit.

26. A column interface circuit as in claim 19 wherein:

each of the logical columns of the memory array comprises a respective plurality "N" of physical columns; and the word-width of the memory array is equal to "N" bits.

27. A column interface circuit as in claim 26 wherein "N" equals 8.

28. A column interface circuit as in claim 27 wherein the plurality of ports of the memory array numbers four ports.

29. A column interface circuit as in claim 16 wherein each of the memory cells of the memory array includes a pair of load resistors.

30. A column interface circuit as in claim 16 wherein each of the memory cells of the memory array includes a pair of P-channel load transistors.

31. A column interface circuit as in claim 19 further comprising:

a plurality of match generators coupled to each column write control circuit, each match generator for respectively comparing a unique pair of port addresses presented to the memory array.

32. A column interface circuit as in claim 31 wherein each of the plurality of match generators comprises:

a comparison circuit for generating an active comparator signal whenever a row address presented to a first port of the respective unique pair matches a row address presented to a second port of the respective unique pair, and either the column address presented to the first port differs from a column address presented to a second port or the second port is enabled for reading.

33. A column interface circuit as in claim 32 wherein each of the plurality of match generators further comprises:

a first circuit for generating a first match signal output whenever the comparator signal is active and the first port is enabled for writing; and a second circuit for generating a second match signal output whenever the comparator signal is active and the second port is writing.

* * * * *